United States Patent
Li et al.

(10) Patent No.: US 8,859,437 B2
(45) Date of Patent: Oct. 14, 2014

(54) SOLUTION FOR ETCHING A THIN FILM TRANSISTOR AND METHOD OF MANUFACTURING THE SAME

(71) Applicants: Yuanyuan Li, State College, PA (US); Kaige Sun, State College, PA (US); Thomas N. Jackson, State College, PA (US)

(72) Inventors: Yuanyuan Li, State College, PA (US); Kaige Sun, State College, PA (US); Thomas N. Jackson, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 0 days.

(21) Appl. No.: 13/731,728

(22) Filed: Dec. 31, 2012

(65) Prior Publication Data
US 2014/0193945 A1   Jul. 10, 2014

(51) Int. Cl.
*H01L 21/302* (2006.01)
*H01L 21/465* (2006.01)
*H01L 21/463* (2006.01)

(52) U.S. Cl.
CPC ............ *H01L 21/465* (2013.01); *H01L 21/463* (2013.01)
USPC ..................... 438/754; 438/104; 257/E21.219

(58) Field of Classification Search
USPC ................... 438/749; 257/E21.221, E21.305, 257/E21.483
See application file for complete search history.

(56) References Cited

U.S. PATENT DOCUMENTS 6,396,148 B1 * 5/2002 Eichelberger et al. ........ 257/758

OTHER PUBLICATIONS

Beverskog, B. and I. Puigdomenech, "Revised pourbaix diagrams for zinc at 25-300 °C." Corrosion Science, vol. 39, No. 1, pp. 107-114 (1997).
Chang, Y.-H.; Wang, S.-M.; Liu, C.-M.; Chen, C., "Fabrication and Characteristics of Self-Aligned ZnO Nanotube and Nanorod Arrays on Si Substrates by Atomic Layer Deposition", J. Electrochemical Society, 157, pp. K236-K241 (2010).
Li, Y.V. et al. "Trilayer ZnO Thin-Film Transistors With in Situ Passivation" IEEE Electron Device Letters, vol. 34, Issue: 11, pp. 1400-1402, Nov. 2013.
Öztürk, S. et al., "Fabrication of ZnO nanowires and nanorods" Physica E, 44, pp. 1062-1065 (2012).
Öztürk, S. et al. "Fabrication of ZnO nanowires at room temperature by cathodically induced sol-gel method" Applied Physics A: Materials Science & Processing, 99, pp. 73-78 (2010).
Wang, Z. et al. "Highly ordered zinc oxide nanotubules synthesized within the anodic aluminum oxide template" Applied Physics A, 74, pp. 201-203 (2002).
Xu, S., et al. "One-dimensional ZnO nanostructures: Solution growth and functional properties" Nano Research, 4, pp. 1013-1098 (2011).

* cited by examiner

*Primary Examiner* — Cheung Lee
(74) *Attorney, Agent, or Firm* — Cantor Colburn LLP

(57) ABSTRACT

Disclosed herein is an aqueous alkaline etching solution comprising water and an alkaline material being selected from the group consisting of ammonium hydroxide, ammonium phosphate, ammonium carbonate, quaternary ammonium hydroxide, quaternary ammonium phosphate, quaternary ammonium carbonate, an alkali metal hydroxide, an alkaline earth metal hydroxide, or a combination comprising at least one of the foregoing alkaline materials; the aqueous alkaline solution being operative to etch aluminum oxide at a rate greater than or equal to about 2:1 over a rate at which it etches a metal oxide semiconductor to be protected; wherein the aqueous etching solution has a pH of 8 to 13.

22 Claims, 5 Drawing Sheets

SOLUTION FOR ETCHING A THIN FILM TRANSISTOR AND METHOD OF MANUFACTURING THE SAME

This disclosure relates to thin film transistors and to methods of manufacturing the same. In particular, this disclosure is related to thin film transistors having a dielectric layer that comprises aluminum oxide and a metal oxide semiconductor layer and to methods of preferentially etching the aluminum oxide with respect to the metal oxide semiconductor layer.

Electronic devices, such as integrated circuits, smart packages and electronic displays, for example, may comprise one or more components, such as one or more thin film transistors (TFTs). Metal oxide semiconductors have gained widespread interest for TFT applications due to their high carrier mobility and potential better stability compared to aSi:H. Since most oxide semiconductors can have interactions with changes in atmosphere and chemicals used in processes, it is important to protect oxide semiconductors from exposure to the atmosphere and to chemicals.

FIG. 1A is a schematic depiction of an exemplary thin film transistor 100 with a top gate, top contact structure. The thin film transistor 100 comprises a substrate 102 upon which is disposed an active layer 108 (also sometimes referred to as a "channel layer") and aluminum layer 110A. The substrate 102 can be an electrically insulating layer or an electrically conducting layer with insulating surface coating. When the substrate is electrically insulating, it comprises an inorganic insulator (e.g., glass, silicon dioxide, and the like) or an organic insulator (e.g., polymers such as polyethylene terephthalates (PET), polyethersulfones (PES), polyetherimides (PEI), polycarbonates (PC), polyethylenenaphthalates (PEN), acrylics including polymethylmethacrylates (PMMA), and the like) or a combination thereof.

The active layer 108 is a metal oxide semiconductor material. Exemplary semiconductor materials that can be used in the channel layer 108 are zinc oxide, indium zinc oxide, indium gallium zinc oxide, magnesium zinc oxide, indium gallium magnesium zinc oxide, tin oxide, indium oxide, gallium oxide, copper oxide, silver oxide, and combinations thereof.

Disposed upon the channel layer 108 is an aluminum oxide layer 110A. The layers 108 and 110A are deposited in one run without breaking a vacuum (used during manufacturing) to protect the back surface of the layer 108. Disposed upon the double layer structure are the source and drain electrodes 106. Disposed upon the source and drain electrodes 106 are the aluminum oxide layer 110B as a dielectric layer and an electrode layer 112. It is desirable to etch the aluminum oxide layer preferentially over the active layer material (i.e., the metal oxide semiconductor layer) to open access windows for source/drain contacts.

FIG. 1B depicts another thin film transistor 100 having a bottom gate structure. In these thin film transistors, an inverted staggered structure is used. In these devices, a first layer of aluminum oxide 110A serves as the gate dielectric for a bottom gate, followed by a layer of metal oxide semiconductor 108, followed by a second layer of aluminum oxide 110B which serves as a passivation layer. As can be seen in the FIG. 1B, disposed upon the substrate 102 is the electrically conducting layer 112, the transistor gate metal or conductive oxide. Disposed upon the electrically conducting layer 112 is the trilayer structure that comprises aluminum oxide layers 110A and 110B between which is sandwiched the metal oxide semiconductor layer 108. Disposed upon the trilayer structures are the source and drain electrodes 106.

In the process of manufacturing a thin film transistor that comprises an aluminum oxide passivation layer 110B and metal oxide semiconductor layer 108 (See FIG. 1B), it is desirable to etch the aluminum oxide layer 110B preferentially over the metal oxide semiconductor 108. Using a selective etchant for the aluminum oxide layer 110B over the metal oxide semiconductor layer 108 permits selectively etching portions of the top aluminum oxide layer (see FIG. 1B) whilst stopping the etching on the metal oxide semiconductor layer without damaging the metal oxide semiconductor. The patterned openings in the aluminum oxide layer 110B are then used for depositing the metallic contacts which form the source and the drain electrodes 106. This process allows the metal oxide semiconductor device to be fabricated with all three layers (aluminum oxide gate dielectric 110A, metal oxide semiconductor layer 108, and top aluminum oxide passivation layer 110B) being deposited in a single loading in a one-step deposition system while the oxide semiconductor channel region is protected from subsequent processing by aluminum oxide layers on the top and bottom.

The selective etch permits the layer of aluminum oxide 110B to be etched to reach the metal oxide semiconductor layer 108. For example, the selective etch can be used to fabricate bottom gate trilayer thin film transistors, similar in concept and structure to bottom gate a-Si:H trilayer thin film transistors.

Solutions that permit the selective etching of aluminum oxide over metal oxide semiconductor such as zinc oxide are however, difficult to find. Aluminum oxide is fairly resistive to chemicals, but, for example, zinc oxide can be etched easily in many chemicals, so it is difficult to etch the aluminum oxide layer 110B and stop at the zinc oxide layer 108 without hurting the zinc oxide. In short, most etchant solutions that can etch aluminum oxide also rapidly etch metal oxide semiconductors. Such etchant solutions would damage the metal oxide semiconductor layer 108. It is therefore desirable to develop solutions and methods that can preferentially etch aluminum oxide over metal oxide semiconductor in a semiconductor device or thin film transistor without damaging the metal oxide semiconductor layer.

Disclosed herein is an aqueous alkaline etching solution comprising water and an alkaline material; the alkaline material being selected from the group consisting of ammonium hydroxide, quaternary ammonium hydroxide, an alkali metal hydroxide, ammonium phosphate, quaternary ammonium phosphate, ammonium carbonate, quaternary ammonium carbonate, an alkaline earth metal hydroxide, or a combination comprising at least one of the foregoing alkaline materials; the aqueous alkaline solution being operative to etch aluminum oxide at a rate greater than or equal to about 2:1 over a rate at which it etches a metal oxide semiconductor to be protected; wherein the aqueous etching solution has a pH of 8 to 13.

Disclosed herein too is a method of manufacturing an aqueous alkaline etching solution comprising mixing an alkaline material and water; the alkaline material being selected from the group consisting of ammonium hydroxide, quaternary ammonium hydroxide, ammonium phosphate, ammonium carbonate, quaternary ammonium carbonate, quaternary ammonium phosphate, an alkali metal hydroxide, an alkaline earth metal hydroxide, or a combination comprising at least one of the foregoing alkaline materials; the aqueous alkaline solution being operative to etch aluminum oxide at a rate greater than or equal to about 2:1 over a rate at which it etches a metal oxide semiconductor to be protected; wherein the aqueous etching solution has a pH of 8 to 13.

Disclosed herein too is a method of using an aqueous alkaline etching solution comprising disposing a metal oxide semiconductor device into the aqueous alkaline etching solution; where the metal oxide semiconductor device comprises a metal oxide multilayer that comprises a aluminum oxide layer disposed upon a metal oxide semiconductor layer; and wherein the aqueous alkaline etching solution comprises an alkaline material and water; the alkaline material being selected from the group consisting of ammonium hydroxide, quaternary ammonium hydroxide, ammonium phosphate, quaternary ammonium phosphate, ammonium carbonate, quaternary ammonium carbonate, an alkali metal hydroxide, an alkaline earth metal hydroxide, or a combination comprising at least one of the foregoing alkaline materials the aqueous alkaline solution being operative to etch aluminum oxide at a rate greater than or equal to about 2:1 over a rate at which it etches the metal oxide semiconductor layer; wherein the aqueous etching solution has a pH of 8 to 13.

Figure 1A:
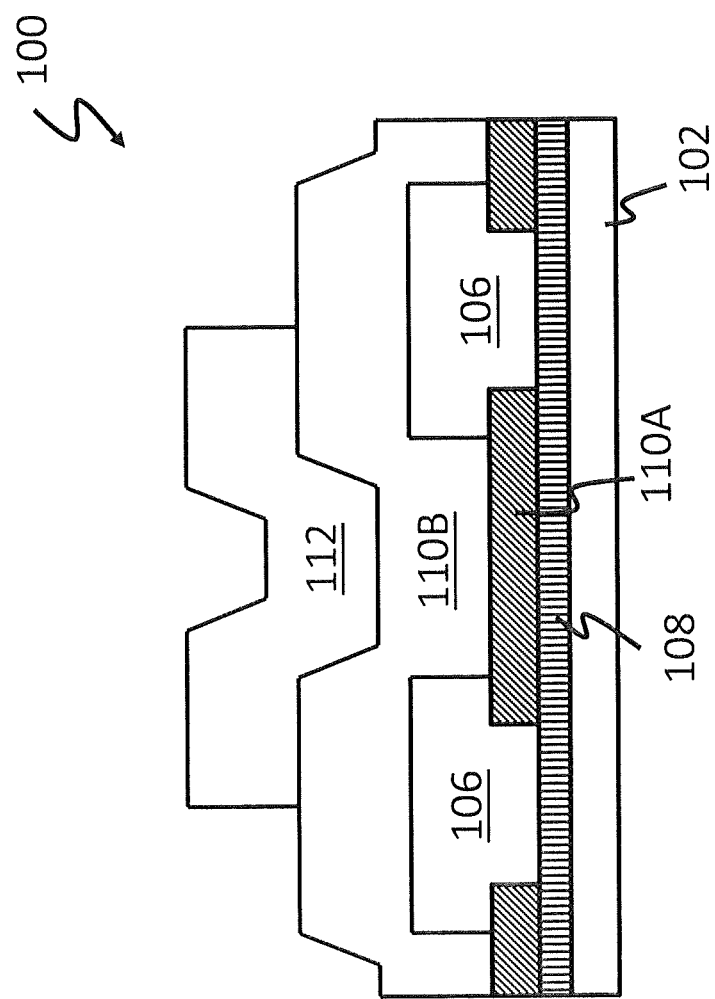
FIG. 1A is a schematic depiction of an exemplary top gate top contact thin film transistor.

Disclosed herein is an aqueous alkaline etching solution that can preferentially and selectively etch aluminum oxide over a metal oxide semiconductor. The aqueous alkaline solution has a pH of 8 to 13 and comprises water, an alkaline material. In an exemplary embodiment, the aqueous alkaline solution comprises water, an alkaline material, a surfactant, a buffer solution, and a metal oxide material. The aqueous alkaline etching solution can advantageously etch aluminum oxide in an amount of 2 nanometers to 95 nanometers per minute. It can be used over a wide range of temperatures, with a lower etch rate at lower temperatures of 15 to 25° C. and significantly increased etch rates at higher temperatures of 40 to 60° C. In one embodiment, the aqueous alkaline etching solution can etch aluminum oxide at least two orders of magnitude faster than zinc oxide, but prevents any damage from occurring to the zinc oxide.

The alkaline material is an ammonium hydroxide, ammonium phosphate, quaternary ammonium hydroxide, ammonium phosphate, quaternary ammonium phosphate, ammonium carbonate, quaternary ammonium carbonate, an alkali metal hydroxide, an alkaline earth metal hydroxide, or a combination comprising at least one of the foregoing alkaline materials. Exemplary quarternary ammonium hydroxides are trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl)ammonium hydroxide, monomethyltri(2-hydroxyethyl)ammonium hydroxide, tetraethyl ammonium hydroxide, tetrapropyl ammonium hydroxide, tetrabutyl ammonium hydroxide, monomethyltriethyl ammonium hydroxide, monomethyltripopyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, or the like, or a combination comprising at least one of the foregoing quarternary ammonium hydroxides.

Exemplary quarternary ammonium phosphates are tetramethyl-ammonium phosphate, tetra-ethyl-ammonium phosphate, tetra-butyl-ammonium phosphate, or the like, or a combination comprising at least one of the foregoing tetraalkyl-ammonium phosphates. These alkaline materials can provide a metal ion free etching solution and avoid metal ion contamination during manufacturing.

Exemplary quarternary ammonium carbonates are tetramethyl-ammonium carbonate, tetra-ethyl-ammonium carbonate, tetra-butyl-ammonium carbonate, or the like, or a combination comprising at least one of the foregoing tetraalkyl-ammonium carbonates. These alkaline materials can also provide a metal ion free etching solution and avoid metal ion contamination during manufacturing.

Examples of alkali metal hydroxides are lithium hydroxide, sodium hydroxide, potassium hydroxide, rubidium hydroxide, cesium hydroxide, or a combination comprising at least one of the foregoing alkali metal hydroxides. Exemplary alkaline earth metal hydroxides are beryllium hydroxide, magnesium hydroxide, calcium hydroxide, strontium hydroxide, barium hydroxide, radium hydroxide, or a combination comprising at least one of the foregoing alkaline earth metal hydroxides.

The alkaline material may be added to the aqueous alkaline etching solution in an amount effective to cause the etching solution to display a pH of 8 to 13, specifically 9 to 12. In one embodiment, the alkaline material is added to the aqueous alkaline etching solution in an amount of $10^{-6}$ to 5 moles per liter, specifically $10^{-5}$ to 3 moles per liter, and more specifically $10^{-5}$ to $10^{-2}$ moles per liter of the aqueous alkaline etching solution.

Suitable surfactants may be optionally added to the aqueous alkaline etching solution. The surfactant helps improve wetting and aids in uniformly and reproducibly patterning small photoresist defined features.

Examples of surfactants are alkynol surfactants, fluorinated surfactants such as fluorinated alkyl alkoxylates such as FLUORAD FC-171®, fluorinated alkylesters such as FC-430 and FC-431 and fluorinated polyoxyethylene alkanols such as FLUORAD® FC-170C, aliphatic acid esters of polyhydric alcohols, polyoxyethylene monoalkyl ethers, polyoxyethylene diols, siloxane type surfactants and alkylene glycol monoalkyl ethers such as butoxypropanol, alkyne surfactants such as 3,5-dimethylhexyne-3-ol (SURFYNOL®-6L®), polyoxypropylene-polyoxyethylene block copolymer such as PLURONIC® from BASF, polyoxyethylene (10) isooctylphenyl ether such as TRITON®, or the like, or a combination comprising at least one of the foregoing surfactants. An exemplary surfactant is 3,5-dimethylhexyne-3-ol commercially available as SURFYNOL®-6L.

The surfactant is generally used in a weight ratio of 1:50 to 1:100,000, specifically 1:100 to 1:900, and more specifically 1:150 to 1:750 based on the total weight of the aqueous alkaline etching solution.

The aqueous alkaline etching solution may also optionally comprise a buffering agent. The buffering agent facilitates achieving and maintaining a desired pH for the aqueous alkaline etching solution. A variety of buffering agents may be used in the aqueous alkaline etching solution. Weak acids, bases and their conjugate salts such as, quaternary ammonium salt, weak mineral or organic acids and their conjugate salts may be used singly or in combination as buffering agents in the aqueous alkaline etching solution. For example, a buffering agent comprising alkali metal (sodium, potassium) carbonates, bicarbonates or phosphates may be used to facilitate maintaining a pH of 8 to 13 for the aqueous alkaline etching solution. In an exemplary embodiment, a mixture of sodium carbonate and sodium bicarbonate may be used in the aqueous alkaline etching solution.

The buffering agent is used in the aqueous alkaline etching solution in amounts of up to 100 wt % to control pH value, based on the total weight of the aqueous alkaline etching solution. As noted above, the aqueous alkaline etching solution may be used without a buffer and/or the surfactant.

Figure 1B:
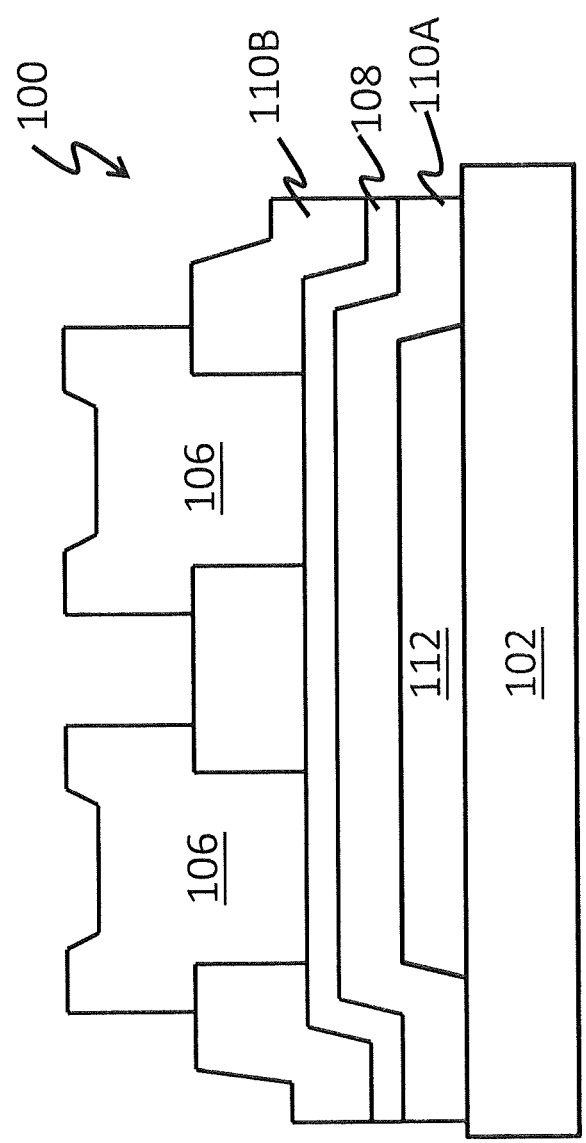
FIG. 1B is a schematic depiction of an exemplary inverted staggered bottom gate thin film transistor with a trilayer structure that comprises aluminum oxide layers between which is sandwiched a metal oxide semiconductor layer.

The metal oxide is added to the aqueous alkaline etching solution in order to improve the initial etch selectivity. A metal salt may also be added to the aqueous alkaline etching solution in addition to the metal oxide material or in lieu of the metal oxide material. The metal oxide or the salts generally act as a source of ions that are similar to the ions in the metal oxide semiconductor layer whose etching is not desired. For example, with reference once again to the FIG. 1B, it is desired to etch the aluminum oxide layer 110B without etching or damaging the metal oxide layer 108. If the metal oxide layer 108 comprises zinc oxide, it is therefore desirable to add a metal oxide or a salt that contains zinc (or can release zinc ions) to the aqueous alkaline etching solution. Without being limited by theory, it is believed that the zinc ions in the aqueous alkaline etching solution inhibit the etching of the zinc oxide layer in the thin film transistor. The metal oxide and/or the salt are therefore selected to have and to generate ions that are similar to the ions in the layer whose etching is not desired or whose etching is to be controlled.

Suitable metal oxides for use in the aqueous alkaline etching solution are zinc oxide, gallium indium zinc oxide, indium tin oxide, indium zinc oxide, aluminum doped zinc oxide, or the like, or a combination comprising at least one of the foregoing metal oxide solids. An exemplary metal oxide material is zinc oxide. The metal oxide material does not contain a metal that is an alkali metal or an alkaline earth metal.

Exemplary metal salts are zinc sulfate, zinc chloride, zinc nitrate, zinc phosphate, zinc stearate, zinc gluconate, zinc ricineolate, or the like or a combination comprising at least one of the foregoing zinc salts.

The metal oxides are used in the aqueous alkaline etching solution in amounts of $10^{-4}$ to 1 wt %, based on the total weight of the aqueous alkaline etching solution.

The aqueous alkaline etching solution also contains water. The water may be distilled water, deionized water, recycled water, or the like, or a combination comprising at least one of the foregoing forms of water. In an exemplary embodiment, the water is deionized water. In one embodiment, deuterated water may be used to substitute the water in part or in whole. In an exemplary embodiment, deuterated water may be used in an amount of 10 to 50 wt %, based on the total weight of water used in the aqueous alkaline etching solution.

In one embodiment, in one method of manufacturing the aqueous alkaline etching solution, the water, the alkaline material, the surfactant, buffering agent and the metal oxide, in the appropriate quantities are mixed in a reactor to produce the aqueous alkaline etching solution. The mixing is effected by agitation. The reactor may be a batch reactor or a continuous reactor and the mixing may be effected by a combination of forces and energy involving shear forces, extensional forces, compressive forces, ultrasonic energy, electromagnetic energy, thermal energy or combinations comprising at least one of the foregoing forces or forms of energy and is conducted in processing equipment wherein the aforementioned forces or forms of energy are exerted by a single screw, multiple screws, intermeshing co-rotating or counter rotating screws, non-intermeshing co-rotating or counter rotating screws, reciprocating screws, screws with pins, screws with screens, barrels with pins, rolls, rams, helical rotors, magnetrons, klystrons, cavitation, or a combination comprising at least one of the foregoing.

Mixing involving the aforementioned forces or forms of energy may be conducted in machines such as single or multiple screw extruders, Buss kneader, Henschel, helicones, Ross mixer, Banbury, roll mills, molding machines such as injection molding machines, vacuum forming machines, blow molding machine, kettles, or the like, or combinations comprising at least one of the foregoing machines. In one embodiment, the mixture may be stirred by hand in a beaker.

The components of the aqueous alkaline etching solution may be mixed at a temperature of 1 to 99° C., specifically at a temperature of 18 to 60° C.

In one embodiment (with reference to the FIG. 1B), in one method of manufacturing the thin film transistor 100, the substrate 102 has disposed upon it the electrode layer 112. The electrode layer 112 may be disposed upon the substrate 102 by metal deposition methods such as thermal evaporation, ebeam evaporation, radio frequency, direct-current sputtering and the like. Appropriate masks and photoresists may be used to facilitate the formation of the electrode layer 112. In one embodiment, a tri-layer comprising aluminum oxide 110A, zinc oxide 108 and passivation layer aluminum oxide 110B may be disposed using either atomic layer deposition or plasma enhanced atomic layer deposition. Following the formation of the multilayer films, the thin film transistor is subjected to etching.

In one embodiment, the aqueous alkaline etching solution can be used to etch the aluminum oxide over the zinc oxide by a variety of different methods involving mechanical abrasion, mechanical abrasion combined with electrical etching, chemical etching, chemical abrasion combined with electrical etching, mechanical abrasion combined with chemical etching, and mechanical abrasion combined with chemical etching and electrical etching. In one embodiment, in one method of etching a thin film transistor 100, the thin film transistor (having a multilayer metal oxide layer comprising aluminum oxide and zinc oxide) to be etched is disposed in a containment vessel 200 as shown in the FIG. 2A. The containment vessel 200 comprises a top plate 220, a base plate 222 and a side wall 224. The containment vessel 200 comprises a first platform 202 to which the thin film transistor 100 is affixed. The thin film transistor 100 is affixed to a first platform 202 such that the multilayer metal oxide layer (comprising 108 and 110A and/or 110B) is opposedly disposed with respect to a second platform 204.

Figure 2A:
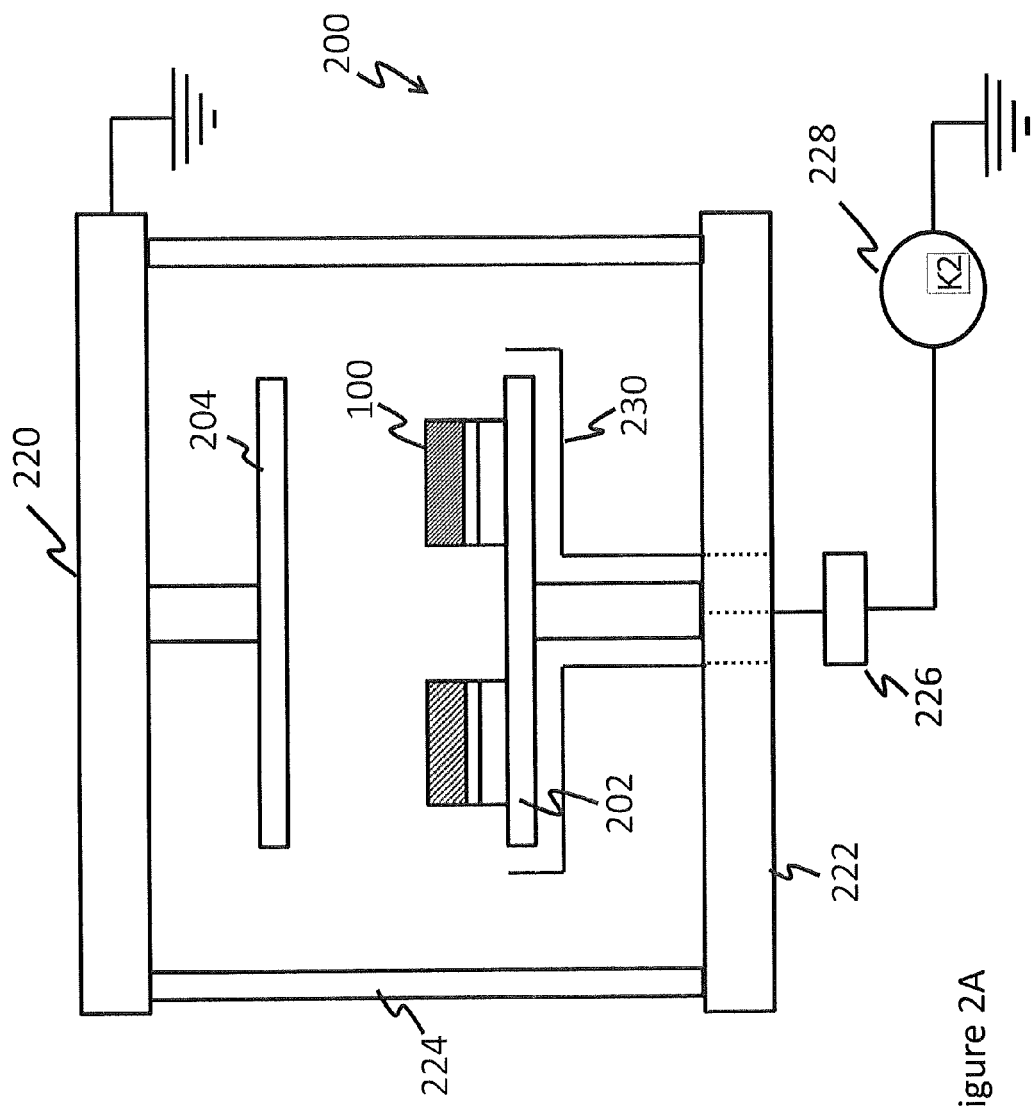
FIG. 2A is a schematic depiction of an etching system that is used for the etching of the metal oxide semiconductor device.

The first platform 202 is a rotary platform that can be rotated via a motor 226, while the second platform 204 is a stationary platform that has an optional abrasive surface. While the FIG. 2A depicts the second platform 204 as being disposed above the first platform 202, their respective positions may be reversed, with the first platform 202 being the rotary platform and disposed above a stationary second platform 204. In addition, the thin film transistor 100 may be affixed to the stationary second platform 204 instead of the first platform 202, where the first platform comprises the optional abrasive surface. The rotary platform is in mechanical communication with a motor 226.

In one embodiment, the first platform 202 is a cathode and the second platform 204 is an anode. An electrical field may be applied between the first platform 202 and the second platform 204 if desired. The aqueous alkaline etching solution may be disposed upon the surface multilayer metal oxide layer or fed (not shown) to the surface of the second platform 204 which is opposed to the surface of the multilayer metal oxide layer that is to be etched. The aqueous alkaline etching solution thus contacts the surface of the multilayer metal oxide layer and facilitates etching the aluminum oxide over the zinc oxide.

In one embodiment, the first platform 202 with the thin film transistors affixed thereto may be rotated while contacting the thin film transistors with the second platform 204. The second platform 204 has an abrasive surface and the combination of the alkaline etching solution in conjunction with the abrasive surface facilitates the removal of the aluminum oxide over the zinc oxide from the multilayer metal oxide layer. The alkaline etching solution facilitates the chemical etching of the aluminum oxide over the zinc oxide, while the abrasive surface enhances the removal of the aluminum oxide by abrasion.

In another embodiment, an electrical field may be applied between the first platform 202 and the second platform 204, while the aqueous alkaline etching solution contacts the surface of the multilayer metal oxide layer. The second platform 204 may or may not have an abrasive surface. The aqueous alkaline etching solution may thus etch the surface of the multilayer metal oxide layer by both chemical and electrochemical means. The first platform 204 may be optionally rotated during this operation.

In one embodiment, if the second platform 204 has an abrasive surface, then mechanical abrasion may also be used to etch the surface of the metal oxide layer by rotating the first platform 202.

Figure 2B:
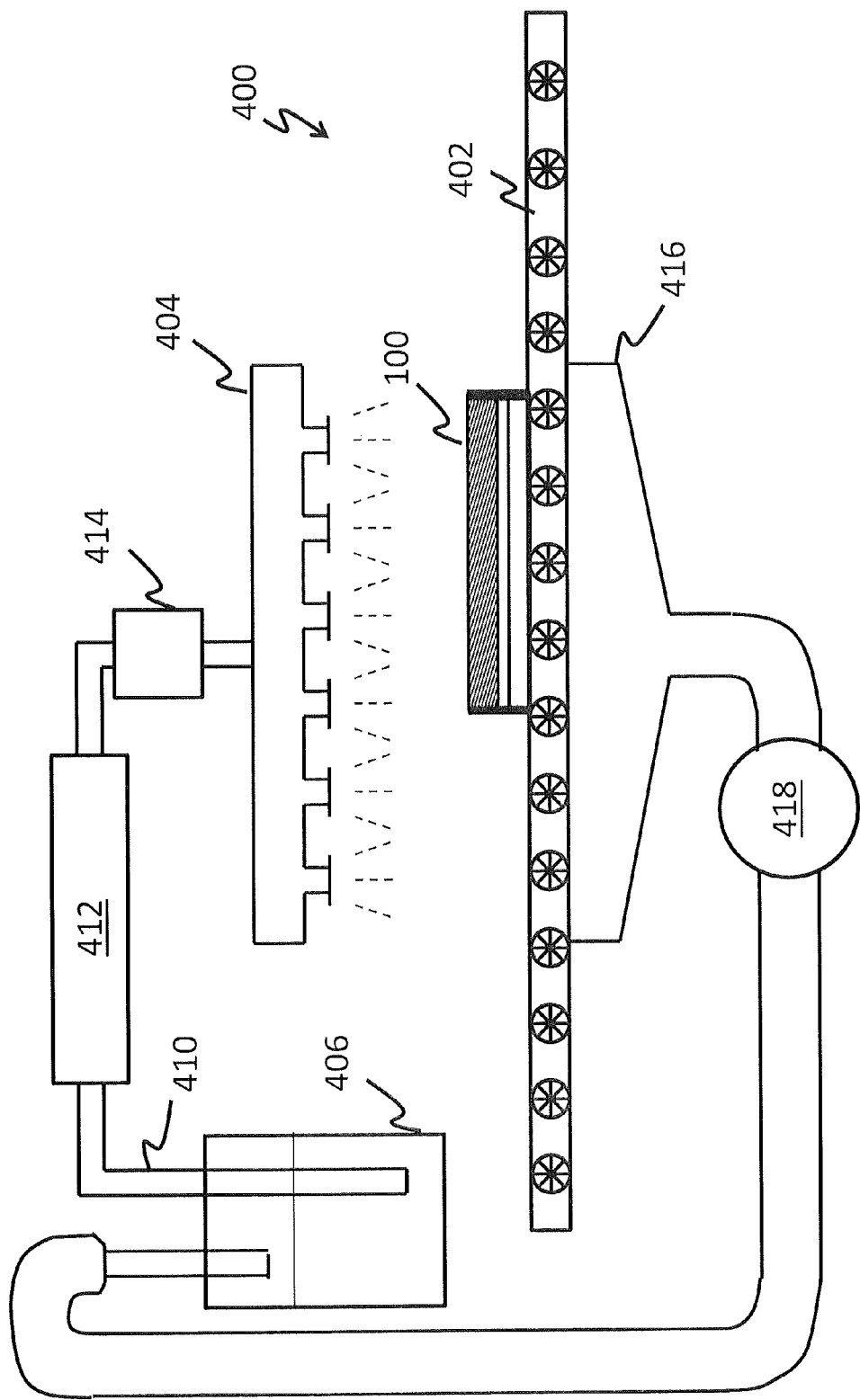
FIG. 2B is a schematic depiction of another etching system for the etching of the metal oxide semiconductor device.

In another embodiment, in another method of etching metal oxide semiconductor device 100, the metal oxide semiconductor device (having a multilayer of aluminum oxide and metal oxide semiconductor, i.e. zinc oxide) is disposed on a conveyer (belt) 402 and transported into a spray etching system 400 as shown in FIG. 2B. Disposed above 402 is a top plate 404 with nozzles on it. Aqueous alkaline etching solution is supplied though tubes 410 from a container 406 to the nozzles 404 and which is then sprayed out onto semiconductor device 100. The temperature of the etching solution can be controlled by heating up container 406 and/or all the tubing to chamber or controlled by going through a heater/chiller assembly 412. A pH meter and thermocouple can be integrated to the container 406 for real time monitoring. A flow and pressure controller 414 is attached to tube 410 at the end close to the top plate 404. Below the conveyer 402 is a drain 416 with a pump 418 where the used solution is pumped and recycled into the solution container 406 (or into waste bottles).

In an exemplary embodiment, the thin film transistor 100 may be only chemically etched by immersing it in the aqueous alkaline etching solution. The thin film transistor may be immersed in the aqueous solution for a desired period of time at a desired temperature to effect the etching. This method of manufacturing the thin film transistor may be effected in a batch or in a continuous manner. In the batch method of manufacturing, sections of the thin film transistor are immersed in a reactor (or a vat) containing the aqueous alkaline etching solution for a desired period of time at a desired temperature to effect the etching. In the continuous method, a large length of the thin film transistor is fed into a reactor containing the aqueous alkaline etching solution at a rate that permits residence in the aqueous alkaline etching solution for a desired period of time at a desired temperature to effect the etching. In one embodiment pertaining to the continuous method of manufacturing the thin film transistor, sections of thin film transistors may be fed into a reactor containing the aqueous alkaline etching solution on a conveyor belt.

The use of the aqueous alkaline etching solution permits selective etching of aluminum oxide over metal oxide semiconductor layers (e.g., zinc oxide, gallium indium zinc oxide, or the like). In one embodiment, the aluminum oxide is etched faster than zinc oxide at a rate of 2:1 to 300:1, specifically 10:1 to 250:1, specifically 50:1 to 220:1, and more specifically 100:1 to 200:1. In one embodiment, the aluminum oxide is etched at a rate of greater than or equal to 10 nanometers per minute (nm/min), specifically greater than or equal to 15 nm/min, and more specifically greater than or equal to 20 nm/min, while at the same time and under the same conditions the zinc oxide is etched at a rate of less than or equal to 0.1 nm/min, specifically less than or equal to 0.09 nm/m, and more specifically less than or equal to 0.05 nm/min. The aluminum oxide may be etched at a rate of up to 100 nm/min depending upon the etching conditions such as applied pressure, temperature and the like. The etching is generally conducted at room temperature (20° C.) to 60° C.

The aqueous alkaline etching solution is advantageous in that it permits the aluminum oxide to be selectively etched over metal oxide semiconductors such as zinc oxide, gallium indium doped ZnO, indium gallium zinc oxide, magnesium zinc oxide or indium gallium magnesium zinc oxide without any destruction to the metal oxide semiconductor layer.

The invention is further illustrated by the following non-limiting examples.

EXAMPLES

Example 1

This example was conducted to demonstrate the preparation of the aqueous alkaline etching solution and its use in selectively etching the aluminum oxide layer over zinc oxide layer in thin film transistors.

In this particular example, the alkaline material is tetramethyl ammonium hydroxide. The etching solution was prepared using 2.5 wt % tetramethyl ammonium hydroxide aqueous solution commercially available as MICROPOSIT® CD26. The buffering agent was a pH 10 aqueous buffer solution of sodium carbonate ($Na_2CO_3$) and sodium bicarbonate ($NaHCO_3$) commercially available as HYDRION® buffer chemvelopes. The surfactant is 3,5-dimethylhexyne-3-ol commercially available as SURFYNOL-6L®, which was added in a volume ratio of 1:1000 based on the total weight of the aqueous alkaline etching solution. Zinc oxide (ZnO) powder was added in an amount of 10 mg per liter of solution. The pH value of the solution was adjusted to 10.5 by balancing the amount of the tetramethyl ammonium hydroxide solution and the buffering agent. Deionized water constituted the remainder of the aqueous alkaline etching solution. In this example, the ratio of tetramethyl ammonium hydroxide to deionized water was 2.5:1000.

The sample was manufactured by disposing zinc oxide and aluminum oxide thin films separately on a silica/silicon wafer by plasma enhanced atomic layer deposition (PEALD). The aluminum oxide film is disposed atop the zinc oxide film and directly in contact with it. The aluminum oxide film together with the zinc oxide film forms the multilayer metal oxide layer. The thin film transistor was then placed in the solution at 60° C. for 2 minutes. The film thickness before and after the treatment was characterized with ellipsometry, and the etch rates are shown as follows in the Table 1.

TABLE 1

| pH | Al$_2$O$_3$ (nm/min) | ZnO (nm/min) |
|---|---|---|
| 10.5 | 20.8 ± 2.1 | 0.1 ± 0.1 |

From the Table 1, it may be seen that the aluminum oxide is etched at a rate that is at least 200 times faster than the rate at which zinc oxide is etched. The aqueous etching alkaline solution thus etches aluminum oxide at a much greater rate than zinc oxide without damaging the zinc oxide layer.

Figure 3:
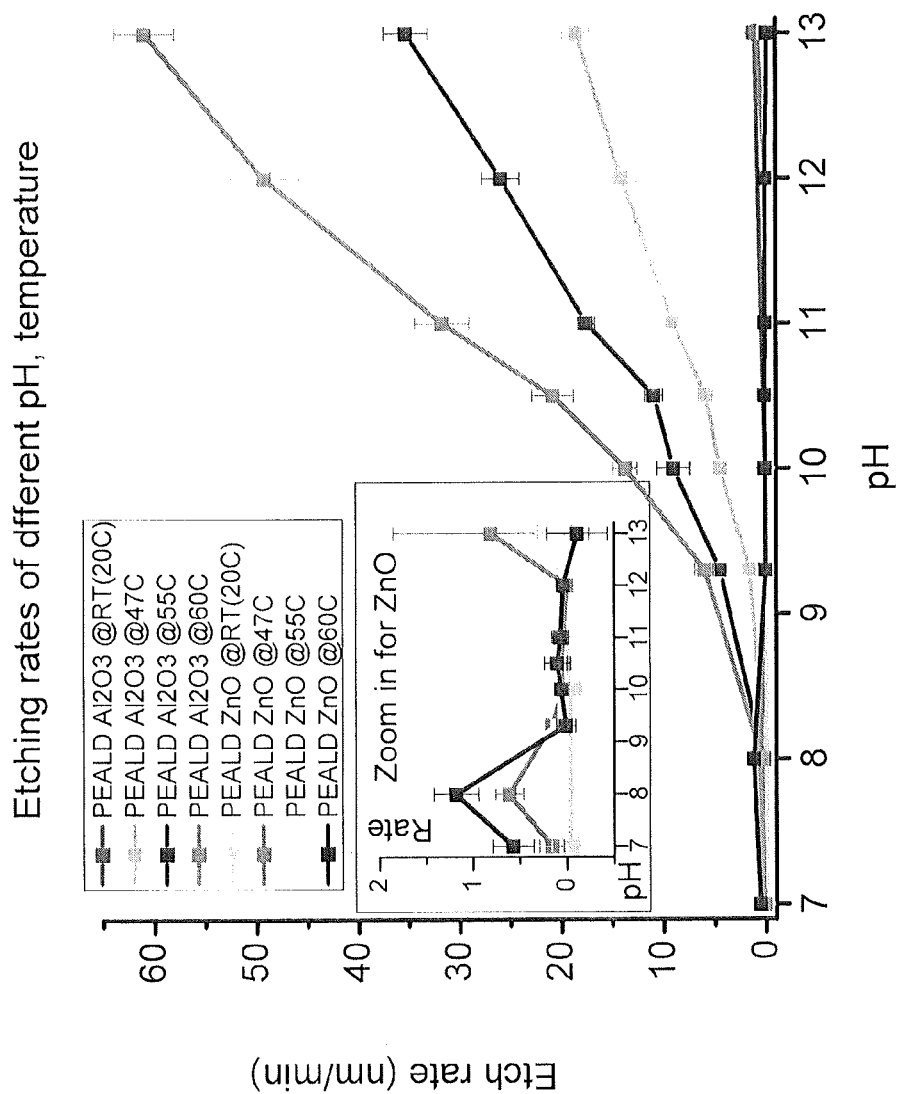
FIG. 3 is graph of the etch rate of $Al_2O_3$ and ZnO films versus pH at different temperatures in the aqueous alkaline etching solution.

The difference between the rates of etching for aluminum oxide and zinc oxide can be seen in the graph in the FIG. 3. The etching was performed under the conditions described above. The FIG. 3 is a graph that depicts the etch rates versus the pH of the aqueous etching alkaline solution at different temperatures. From the figure, it may be seen that at higher values of pH (between 8 and 13) and at higher temperatures (between 45 and 60° C.), the rate of etching of aluminum oxide is increased over the rate of etching of zinc oxide.

Example 2

In this example, the tetramethyl ammonium hydroxide was replaced with sodium hydroxide. The composition was otherwise identical with that described in the Example 1. The etching was conducted in the same manner as described above on a thin film transistor of a composition similar to that described in the Example 1. The results were identical. In other words the sodium hydroxide functioned in a manner similar to the tetramethyl ammonium hydroxide. From the Examples 1 and 2, it may be seen that the aluminum oxide is etched at a rate that is at least 50 times faster, specifically at least 100 times faster, and more specifically at least 200 times than the rate at which zinc oxide is etched. The aqueous etching alkaline solution thus etches aluminum oxide at a much greater rate than zinc oxide without damaging the zinc oxide layer.

What is claimed is:

1. An aqueous alkaline etching solution comprising: water; and an alkaline material; the alkaline material being selected from the group consisting of ammonium hydroxide, ammonium phosphate, quaternary ammonium hydroxide, quaternary ammonium phosphate, ammonium carbonate, quaternary ammonium carbonate, an alkali metal hydroxide, an alkaline earth metal hydroxide, or a combination comprising at least one of the foregoing alkaline materials; the aqueous alkaline solution being operative to etch aluminum oxide at a rate greater than or equal to about 2:1 over a rate at which it etches a metal oxide semiconductor to be protected; wherein the aqueous etching solution has a pH of 8 to 13.

2. The aqueous alkaline etching solution of claim 1, where the alkaline material is metal ion free.

3. The aqueous alkaline etching solution of claim 2, where the quarternary ammonium hydroxide is trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl)ammonium hydroxide, monomethyltri(2-hydroxyethyl)ammonium hydroxide, tetraethyl ammonium hydroxide, tetrapropyl ammonium hydroxide, tetrabutyl ammonium hydroxide, monomethyltriethyl ammonium hydroxide, monomethyltripopyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, or a combination comprising at least one of the foregoing quarternary ammonium hydroxides; the quarternary ammonium phosphate is tetra-methyl-ammonium phosphate, tetra-ethyl-ammonium phosphate, tetra-butyl-ammonium phosphate, or a combination comprising at least one of the foregoing quarternary ammonium phosphates; the quaternary ammonium carbonate is tetra-methyl-ammonium carbonate, tetra-ethyl-ammonium carbonate, tetra-butyl-ammonium carbonate, or a combination comprising at least one of the foregoing quarternary ammonium carbonates; the alkali metal hydroxide is lithium hydroxide, sodium hydroxide, potassium hydroxide, rubidium hydroxide, cesium hydroxide, or a combination comprising at least one of the foregoing alkali metal hydroxides; the alkaline earth metal hydroxide is beryllium hydroxide, magnesium hydroxide, magnesium hydroxide, calcium hydroxide, strontium hydroxide, barium hydroxide, radium hydroxide, or a combination comprising at least one of the foregoing alkaline earth metal hydroxides.

4. The aqueous alkaline etching solution of claim 2, where the quaternary ammonium phosphate is tetra-methyl-ammonium phosphate, tetra-ethyl-ammonium phosphate, tetra-butyl-ammonium phosphate, or a combination comprising at least one of the foregoing quaternary ammonium phosphates.

5. The aqueous alkaline etching solution of claim 2, where the quaternary ammonium carbonate is tetra-methyl-ammonium carbonate, tetra-ethyl-ammonium carbonate, tetra-butyl-ammonium carbonate, or a combination comprising at least one of the foregoing tetra-alkyl-ammonium carbonates.

6. The aqueous alkaline etching solution of claim 1, where the metal oxide semiconductor is selected from the group consisting of zinc oxide, indium zinc oxide, indium gallium zinc oxide, magnesium zinc oxide, gallium zinc oxide, indium gallium magnesium zinc oxide, tin oxide, indium oxide, gallium oxide, copper oxide, silver oxide, and combinations thereof.

7. The aqueous alkaline etching solution of claim 1, where the metal oxide semiconductor is zinc oxide.

8. The aqueous alkaline etching solution of claim 1, further comprising a metal oxide and/or a salt; where the metal oxide and/or the salt does not contain an alkali metal or an alkaline earth metal; where the metal oxide and/or the salt comprises anions that are similar to the anions in the metal oxide semiconductor whose etching is to be controlled or inhibited.

9. The aqueous alkaline etching solution of claim 8, where the metal oxide and/or salt comprises zinc ions.

10. The aqueous alkaline etching solution of claim 1, where the alkaline material is present in an amount of $10^{-6}$ to 5 mole per liter, based on a total volume of the aqueous alkaline etching solution.

11. The aqueous alkaline etching solution of claim 1, further comprising a surfactant with a weight ratio of 1:50 to 1:100000, based on a total weight of the aqueous alkaline etching solution.

12. The aqueous alkaline etching solution of claim 1, further comprising a buffering agent.

13. The aqueous alkaline etching solution of claim 12, where the buffering agent is a weak mineral acid, a weak organic acid, a weak base, a conjugate salt of a weak acid, a conjugate salt of a weak base and combinations thereof.

14. The aqueous alkaline etching solution of claim 1, having a pH of 9 to 12.

15. The aqueous alkaline etching solution of claim 1, where the aqueous alkaline solution is operative to etch aluminum oxide at a rate greater than or equal to about 10:1 over a rate at which it etches zinc oxide.

16. A method of manufacturing an aqueous alkaline etching solution comprising:

mixing an alkaline material; and water; the alkaline material being selected from the group consisting of ammonium hydroxide, a quaternary ammonium hydroxide, an alkali metal hydroxide, an alkaline earth metal hydroxide, an ammonium phosphate, a quaternary ammonium phosphate, an ammonium carbonate, a quaternary ammonium carbonate or a combination comprising at least one of the foregoing alkaline materials; the aqueous alkaline solution being operative to etch aluminum oxide at a rate greater than or equal to about 2:1 over a rate at which it etches a metal oxide semiconductor to be protected; wherein the aqueous etching solution has a pH of 8 to 13.

17. The method of claim 16, comprising further mixing a surfactant and/or a buffering agent into the aqueous alkaline etching solution.

18. The method of claim 16, comprising further mixing a metal oxide and/or a salt with the aqueous alkaline solution; where the metal oxide or salt comprise anions that are similar to the anions in a layer whose etching is to be controlled or inhibited.

19. A method of using an aqueous alkaline etching solution comprising:

disposing a metal oxide semiconductor device into the aqueous alkaline etching solution;

where the metal oxide semiconductor device comprises a dielectric layer that comprises an aluminum oxide layer disposed upon a metal oxide semiconductor layer; and wherein the aqueous alkaline etching solution comprises an alkaline material and water; the alkaline material being selected from the group consisting of ammonium hydroxide, ammonium phosphate, quaternary ammonium hydroxide, quaternary ammonium phosphate, ammonium carbonate, quaternary ammonium carbonate, an alkali metal hydroxide, an alkaline earth metal hydroxide, or a combination comprising at least one of the foregoing alkaline materials; the aqueous alkaline solution being operative to etch aluminum oxide at a rate greater than or equal to about 2:1 over a rate at which it etches the metal oxide semiconductor layer; wherein the aqueous etching solution has a pH of 8 to 13.

20. The method of claim 19, where the metal oxide semiconductor layer comprises zinc oxide.

21. The method of claim 19, further comprising subjecting a thin film to mechanical abrasion, an electrical field, or a combination of mechanical abrasion or an electrical field during the disposing.

22. The method of claim 19, where the aqueous alkaline etching solution further comprises a surfactant and/or a buffering agent; a metal oxide and/or salt whose anions are similar to the anions in the metal oxide semiconductor layer whose etching is to be controlled or inhibited.

* * * * *